United States Patent
Loebowitz et al.

(10) Patent No.: US 9,935,432 B2
(45) Date of Patent: Apr. 3, 2018

(54) HOUSING, IN PARTICULAR AN INDUSTRIAL HOUSING

(71) Applicant: Phoenix Contact GmbH & Co. KG, Blomberg (DE)

(72) Inventors: Torben Loebowitz, Lemgo (DE); Axel Grimm, Steinheim (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 15/123,692

(22) PCT Filed: Mar. 19, 2015

(86) PCT No.: PCT/EP2015/055784
§ 371 (c)(1),
(2) Date: Sep. 6, 2016

(87) PCT Pub. No.: WO2015/144554
PCT Pub. Date: Oct. 1, 2015

(65) Prior Publication Data
US 2017/0018912 A1    Jan. 19, 2017

(30) Foreign Application Priority Data
Mar. 24, 2014  (DE) .................. 10 2014 104 006

(51) Int. Cl.
*H02B 1/01*    (2006.01)
*H02B 1/28*    (2006.01)
(Continued)

(52) U.S. Cl.
CPC ................. *H02B 1/28* (2013.01); *H02B 1/01* (2013.01); *H02B 1/30* (2013.01); *H02B 1/46* (2013.01); *H05K 5/03* (2013.01); *H02B 1/305* (2013.01)

(58) Field of Classification Search
CPC ...... H02G 3/081; H02G 3/14; H01R 13/5213; H02B 1/01
See application file for complete search history.

(56) References Cited

U.S. PATENT DOCUMENTS 4,265,365 A  *  5/1981  Boteler ................. H02G 3/088
                                                    174/53
4,699,293 A  * 10/1987  Duchrow ................ H02B 1/28
                                                    220/3.8
(Continued)

FOREIGN PATENT DOCUMENTS

DE    952284 C    11/1956
FR    2808409 A1  11/2001
(Continued)

OTHER PUBLICATIONS

Japanese Office Action, Japanese Patent Office, dated Nov. 6, 2017, pp. 1-3.

*Primary Examiner* — Dhirubhai R Patel
(74) *Attorney, Agent, or Firm* — Leydig, Voit & Mayer, Ltd.

(57) ABSTRACT

A housing includes a main housing body with an opening in at least one side face of the main housing body; a sealing element on the at least one side face, the sealing element surrounding the edge of the opening; a frame element on the at least one side face, the frame element surrounding the edge of the sealing element; and a cover element for closing the opening, which cover element abuts the frame element and the sealing element in a planar manner when the opening is closed.

9 Claims, 4 Drawing Sheets

(51) Int. Cl.
*H02B 1/46* (2006.01)
*H05K 5/03* (2006.01)
H02B 1/30 (2006.01)

(56) References Cited

U.S. PATENT DOCUMENTS

| | | | | |
|---|---|---|---|---|
| 5,232,277 | A * | 8/1993 | Cassady | E05D 5/065 16/221 |
| 5,739,463 | A * | 4/1998 | Diaz | H05K 5/068 174/378 |
| 6,798,966 | B2 * | 9/2004 | Loh | G02B 6/293 385/134 |
| 6,852,924 | B2 * | 2/2005 | Lessard | H05K 9/0073 174/377 |
| 7,388,160 | B2 * | 6/2008 | Mok | H05K 9/0007 174/377 |
| 8,222,522 | B1 * | 7/2012 | Easthouse | H02G 3/088 174/66 |
| 8,796,548 | B2 * | 8/2014 | Rost | H05K 5/061 174/50 |

FOREIGN PATENT DOCUMENTS

| | | |
|---|---|---|
| JP | 5824928 U | 2/1983 |
| JP | 042081 U | 1/1992 |
| JP | 04259286 A | 9/1992 |
| KR | 200462614 Y1 | 9/2012 |
| KR | 101326006 B1 | 11/2013 |

* cited by examiner

HOUSING, IN PARTICULAR AN INDUSTRIAL HOUSING

CROSS-REFERENCE TO PRIOR APPLICATIONS

This application is a U.S. National Phase application under 35 U.S.C. § 371 of International Application No. PCT/EP2015/055784, filed on Mar. 19, 2015, and claims benefit to German Patent Application No. DE 10 2014 104 006.6, filed on Mar. 24, 2014. The International Application was published in German on Oct. 1, 2015 as WO 2015/144554 A1 under PCT Article 21(2).

FIELD

The invention relates to a housing, in particular an industrial housing.

BACKGROUND

Industrial housings of this kind can, for example, be used as switch cabinets, terminal boxes and the like for electrical switchgears, connectors, terminals, etc., for a machine control device, breaker panels and building installations for example. They usually comprise a main housing body, it being possible for one side face of the main housing body to be open in order to be able to provide access to the housing interior for the purpose of assembly, maintenance, adjustments, etc. This open side face can be closed by means of a door. Furthermore, the main housing body can comprise one or more openings on one or more other side faces, for example for cable feedthroughs, which openings can each be closed by a cover element, for example a flange plate.

These housings are used in different environmental conditions, and therefore they have to correspond to specific types of protection, for example against the ingress of moisture and dust and also against the effect of mechanical loads. The opening in one of the side faces of the main housing body that is closed by a cover element is in particular often a weak point.

SUMMARY

A housing includes a main housing body with an opening in at least one side face thereof; a sealing element disposed on the at least one side face, the sealing element surrounding an edge of the opening; a frame element disposed on the at least one side face, the frame element surrounding an edge of the sealing element; and a cover element for closing the opening, the cover element abutting the frame element and the sealing element in a planar manner when the opening is closed.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
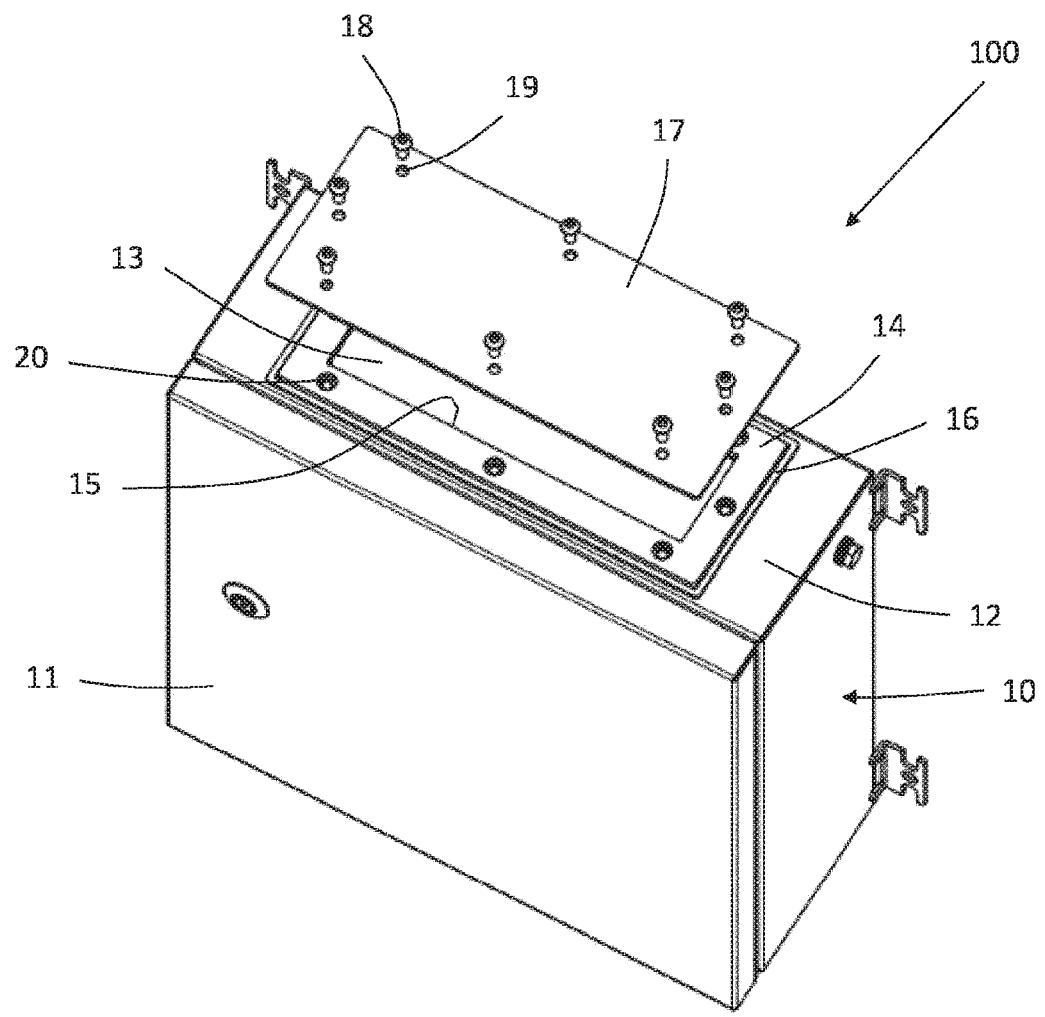
FIG. 1 is a schematic perspective view of a housing according to the invention when it is not closed.

The housing provided by the invention comprises a main housing body, an opening being made in at least one side face of the main housing body. Furthermore, the housing comprises a sealing element that is placed on the side face comprising the opening such that the sealing element surrounds the edge of the opening. Furthermore, the housing comprises a frame element that is placed on the side face of the main housing body that comprises the opening such that the frame element surrounds the edge of the sealing element. In addition, the housing comprises a cover element for closing the opening, which cover element abuts the frame element and the sealing element in a planar manner when the opening is closed.

The housing according to the invention is in particular characterized in that the sealing element, which is arranged between the main housing body and the cover element, is now also protected against external influences, and therefore the sealing effect of the sealing element is protected when external influences act on the housing, and therefore the sealing effect of the sealing element is not adversely affected by external influences acting on the housing. According to the invention, this is achieved by a frame element being placed around the sealing element and the sealing element thus being enclosed by the frame element on its outer circumferential surface. The frame element therefore protects the sealing element on the outside, in particular against mechanical influences and also water jets, for example. Both the sealing element and the frame element abut the side face of the main housing body in a planar manner in this case, the cover element covering the opening, the sealing element and the frame element when the opening is closed. Since the frame element and the sealing element are adjacent to one another and abut the side face of the main housing body comprising the opening, when the opening is closed, the forces acting from the cover element towards the main housing body are conducted away to the frame element due to the cover element being fastened to the main housing body so that the forces acting on the sealing element and therefore the loads for the sealing element can be reduced. Effective and reliable sealing by the sealing element can thus be ensured for a long period of time.

The outer circumferential surface of the cover element is preferably flush with the outer circumferential surface of the frame element in the closed state. Edges between the cover element and the frame element, on which for example dirt can be deposited or moisture can build up, can thus be prevented.

In order in particular to be able to achieve a particularly effective degree of resistance to mechanical influences, the frame element is preferably made of a dimensionally stable material. By making the frame element from a dimensionally stable material, the sealing element can therefore also be particularly effectively protected, since loads acting on the frame element can be prevented from being transferred to the sealing element.

The frame element can, for example, be made of a metal, in particular a stainless steel. If the frame element is made of a stainless steel, the frame element can be particularly corrosion-resistant. The frame element can, however, also be made of other metal materials, such as sheet steel or aluminum. Furthermore, metal materials that are zinc-plated, nickel-plated or finished for protection against corrosion can also be used.

The frame element can, for example, be rigidly fastened to either the side face of the main housing body or to the cover element, for example by means of a bonded connection or a welded connection, for example a spot-welded connection.

The sealing element is preferably made of a resilient material, in particular an open-cell silicone foam. By using an open-cell silicone foam, partially particularly high compression of the sealing element is possible, since open-cell silicone foam has a very good compression set (CS). In addition, by using an open-cell silicone foam for the sealing element, a particularly large temperature range can be covered, since open-cell silicone foam can also have very effective sealing properties even under extreme temperature conditions, in particular of between −60° C. and +160° C., and can maintain the functionality over the service life. The sealing element can, however, also be made of other resilient materials, such as closed-cell silicone foam, polyurethane foam or neoprene foam.

In order to be able to further increase the sealing effect of the sealing element, the sealing element preferably has a greater height than the frame element when the opening is not closed. If the opening is closed by the cover element, when placing the cover element on the sealing element, the sealing element can then be compressed or squeezed by the cover element until the cover element comes to abut the frame element. By compressing the sealing element, the sealing element can rest against the cover element and also the side face of the main housing body in a particularly tight and planar manner, thus achieving a particularly effective sealing effect relative to the cover element and the main housing body. When the opening is closed, the sealing element preferably has the same height as the frame element owing to the compression of the sealing element.

In order to bring about the closed state, the cover element can preferably be fastened to the main housing body by means of fastening device, the fastening device preferably being passed through the cover element and the sealing element in the closed state. The cover element preferably comprises a plurality of holes, via which the fastening device can be passed through said cover element. The sealing element preferably also comprises a plurality of through-openings, through which the fastening device can be passed. Screws that can be screwed into threaded holes made in the main housing body can be used as the fastening device, for example. Other fastening devices are likewise conceivable.

FIG. 1 shows a housing 100 in the form of an industrial housing for receiving electrical switching means, for example. The housing 100 comprises a box-shaped main housing body 10. The main housing body 10 can be made of a metal material, in particular a stainless steel material. One side face of the housing 100 is open, on which a door 11 is arranged in order to be able to close said open side face.

Another side face 12 of the main housing body 10 comprises an opening 13, which likewise allows access to the interior of the main housing body 10. A sealing element 14 is placed on the side face 12 comprising the opening 13 in a planar manner such that the sealing element 14, which is made of a resilient material, for example an open-cell silicone foam, surrounds the edge of the opening 13 and encloses it. For this purpose, the two-dimensional, flat sealing element 14 comprises a recess 15 which is arranged in the center of the sealing element 14, the size of the recess 15 corresponding to the size of the opening 13 in the side face 12 of the main housing body 10.

In the embodiment shown here, the main face of the sealing element 14 and of the recess 15 is rectangular. Other shapes of the sealing element 14 or the recess 15 and also of the opening, such as round or other polygonal shapes, are also possible.

The recess 15 is made in the sealing element 14 such that the width of the sealing element 14 between the recess 15 and the outer circumferential surface of the sealing element 14 is the same on all sides of the sealing element 14 in order to be able to achieve equally effective sealing on all sides of the sealing element 14.

In addition to the sealing element 14, a frame element 16 is placed on the side face 12 of the main housing body 10 in a planar manner such that the frame element 16 surrounds the edge of the outer circumferential surface of the sealing element 14 and encloses it. Unlike the sealing element 14, the frame element 16 is made of a dimensionally stable material, in particular a metal material such as stainless steel. The frame element 16 therefore frames the sealing element 14, it being possible for the inner circumferential surface of the frame element 16 to directly rest against the outer circumferential surface of the sealing element 14.

Figure 4:
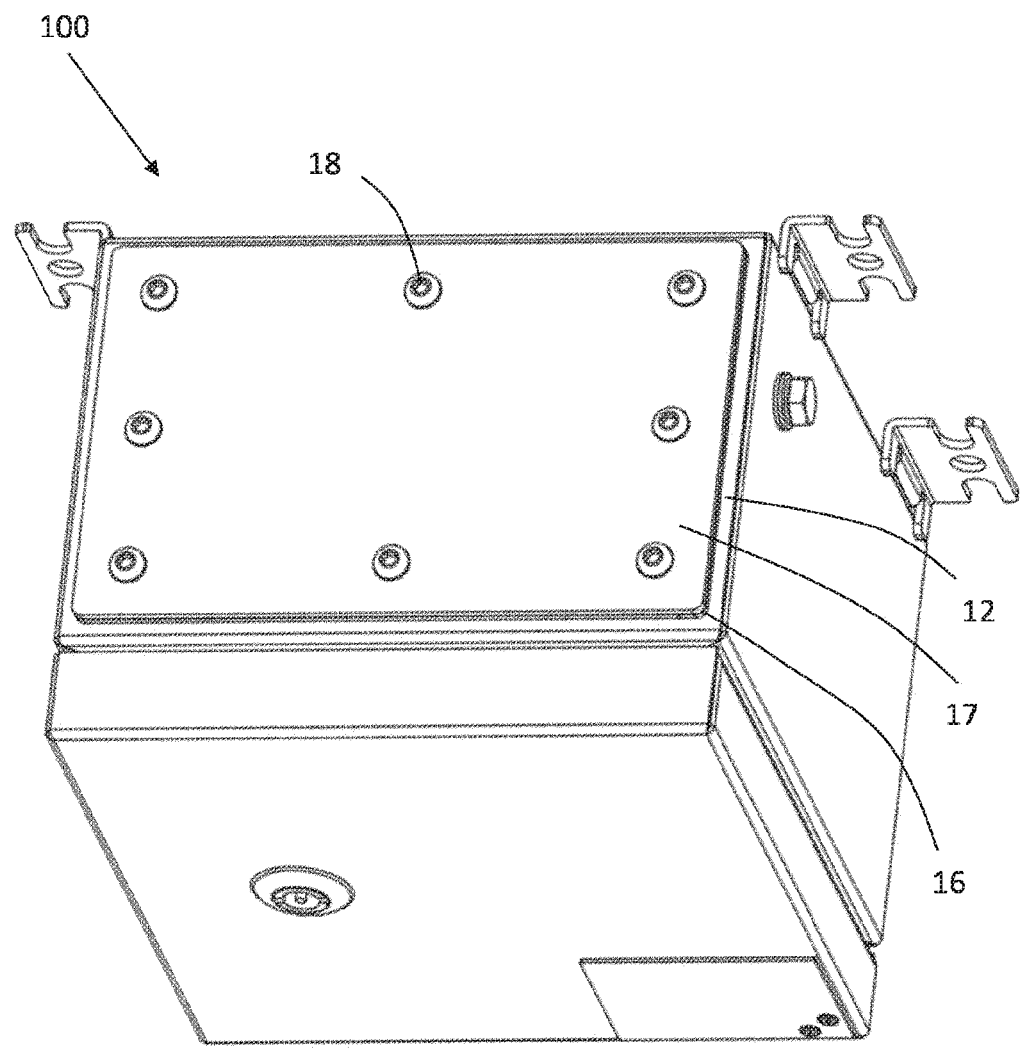
FIG. 4 is a schematic view of the housing shown in FIGS. 1 and 2 in a closed state.

In order to close the opening 13 in the side face 12 of the main housing body 10, a cover element 17 is placed on the sealing element 14 and the frame element 16 in a planar manner such that the cover element 17 covers the sealing element 14 and the frame element 16. The cover element 17 is two-dimensional in this case. In this case, the outer circumferential surface of the cover element 17 corresponds to the outer circumferential surface of the frame element 16 such that the cover element 17 is flush with the frame element 16 when the opening 13 is closed (as shown in FIG. 4). Unlike the sealing element 14, the cover element 17 therefore has a larger outer circumferential surface than the sealing element 14.

The cover element 17 is fastened to the main housing body 10 by means of a plurality of fastening device 18, which are in the form of screws in this case. The cover element 17 comprises a plurality of holes 19 and the sealing element 14 comprises a plurality of through-openings 20, the fastening device 18 being passed through the holes 19 in the cover element 17 and through the through-openings 20 in the sealing element 14, so as to be fastenable, in particular screwable, into threaded holes formed in the main housing body 10.

Figure 2:
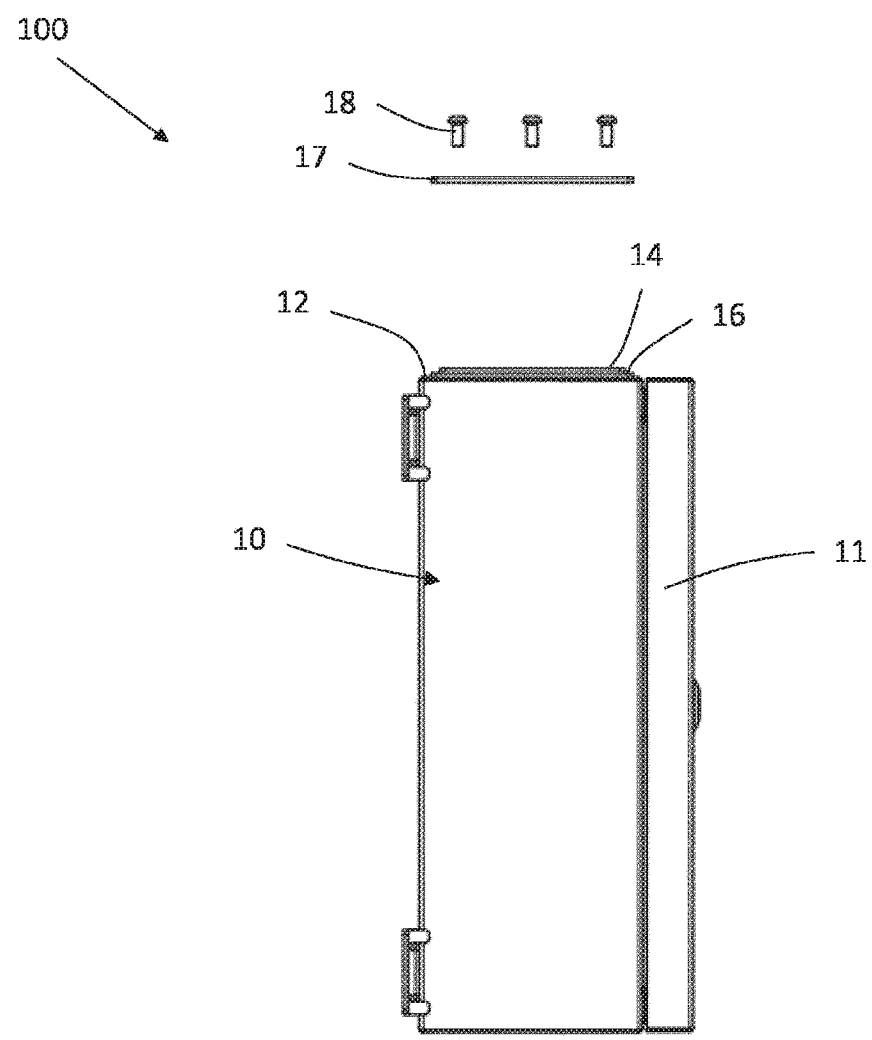
FIG. 2 is a schematic plan view from the side of a housing such as that shown in FIG. 1.
Figure 3:
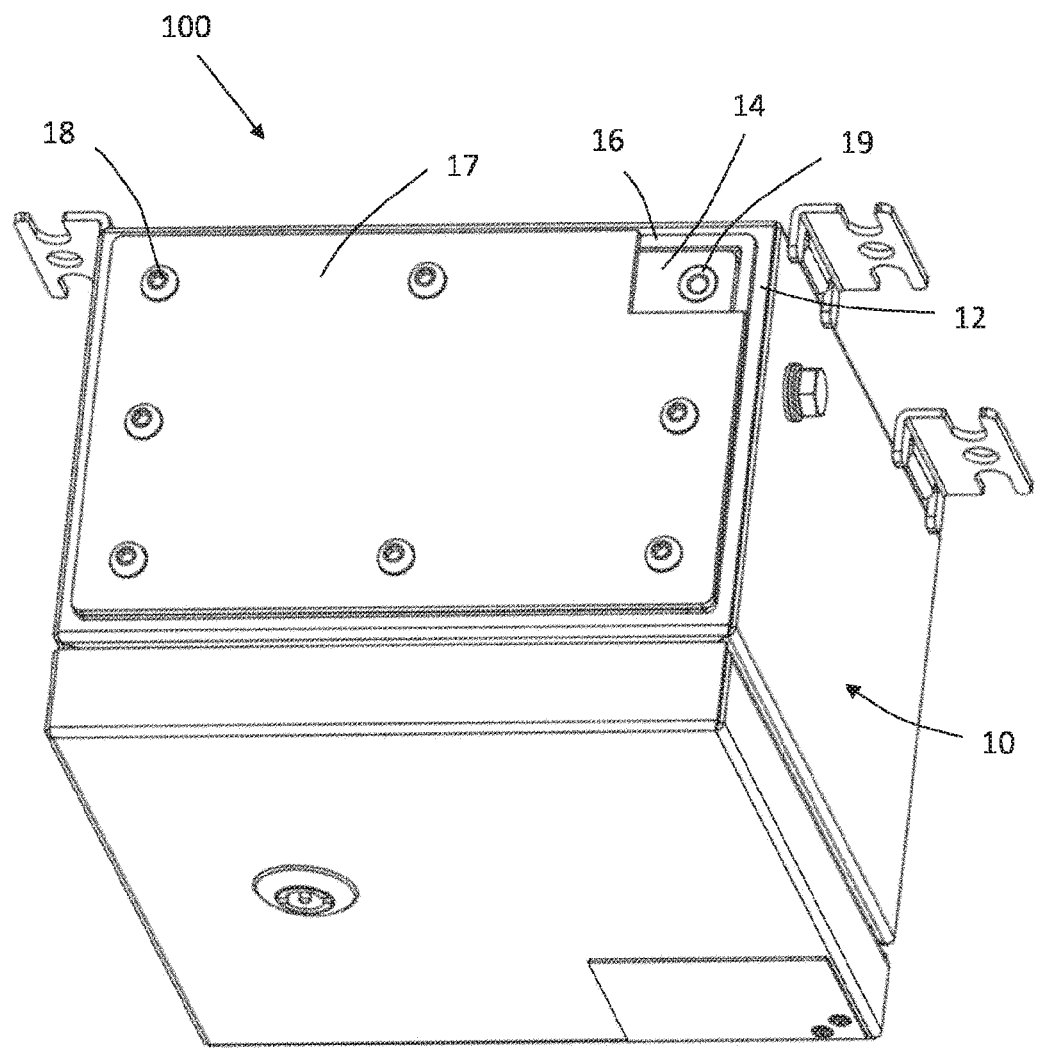
FIG. 3 is a schematic view of the housing shown in FIGS. 1 and 2 in a closed state, with a partially sectional view of the cover element.

As can be seen in particular in FIG. 2, the sealing element 14 has a greater height than the frame element 16 when the opening 13 is not closed, and therefore the sealing element 14 projects above the frame element 16. When the opening 13 is closed, the sealing element 14 is compressed or squeezed by placing the cover element 17 thereon, so that the height of the sealing element 14 is reduced compared with when the opening is not closed. The sealing element 14 is compressed by the cover element 17 until the cover element 17 abuts the frame element 16 in a planar manner. When the opening 13 is closed by means of the cover element 17, the height of the sealing element 14 then corresponds to the height of the frame element 16, as can be seen in FIG. 3 in the partially sectional view of the cover element 17.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS housing 100
main housing body 10
door 11
side face 12
opening 13
sealing element 14
recess 15
frame element 16
cover element 17
fastening device 18
hole 19
through-opening 20

The invention claimed is:

1. A housing, comprising:
a main housing body having an opening in at least one side face thereof;
a sealing element disposed on the at least one side face, the sealing element surrounding an edge of the opening;
a frame element disposed on the at least one side face, the frame element surrounding an edge of the sealing element; and
a cover element sized and shaped to close the opening, the cover element abutting the frame element and the sealing element in a planar manner when the opening is closed, wherein the sealing element is sized and shaped to be fastened to the main housing body by a fastening device, the fastening device being received through the cover element and the sealing element in the closed state.

2. The housing according to claim 1, wherein, in a closed state, an outer circumferential surface of the cover element is flush with an outer circumferential surface of the frame element.

3. The housing according to claim 1, wherein the frame element comprises a dimensionally stable material.

4. The housing according to claim 1, wherein the frame element is comprised of metal.

5. The housing according to claim 4, wherein the metal comprises stainless steel.

6. The housing according to claim 1, wherein the sealing element comprises a resilient material.

7. The housing according to claim 6, wherein the resilient material comprises an open-cell silicone foam.

8. The housing according to claim 1, wherein, when the opening is not closed, the sealing element is higher than the frame element.

9. A housing comprising:
a main housing body having an opening in at least one side face thereof;
a sealing element disposed on the at least one side face, the sealing element surrounding an edge of the opening;
a frame element disposed on the at least one side face, the frame element surrounding an edge of the sealing element; and
a cover element sized and shaped to close the opening, the cover element abutting the frame element and the sealing element in a planar manner when the opening is closed,
wherein, when the opening is not closed, the sealing element is higher than the frame element.

* * * * *